United States Patent
Kim

Patent Number: 5,912,841
Date of Patent: Jun. 15, 1999

[54] REPAIR FUSE CIRCUIT PERFORMING COMPLETE LATCH OPERATION USING FLASH MEMORY CELL

[75] Inventor: Seong Durk Kim, Kyoungki-do, Rep. of Korea

[73] Assignee: Hyundai Electronics Industries Co., LTD., Kyoungki-do, Rep. of Korea

[21] Appl. No.: 08/997,063

[22] Filed: Dec. 23, 1997

[30] Foreign Application Priority Data

Dec. 24, 1996 [KR] Rep. of Korea ............. 96-71406

[51] Int. Cl.⁶ ............................................. G11C 16/06
[52] U.S. Cl. ............................ 365/185.09; 365/225.7; 365/189.05
[58] Field of Search ........................ 365/185.09, 154, 365/189.05, 225.7, 185.33

[56] References Cited

U.S. PATENT DOCUMENTS

| | | |
|---|---|---|
| 5,200,922 | 4/1993 | Rao . |
| 5,237,535 | 8/1993 | Mielke et al. . |
| 5,532,972 | 7/1996 | Pascucci et al. ............ 365/194 |
| 5,602,777 | 2/1997 | Nawaki et al. .......... 365/185.09 |

FOREIGN PATENT DOCUMENTS

WO 91/14227  9/1991  WIPO .

*Primary Examiner*—Huan Hoang
*Attorney, Agent, or Firm*—Jacobson, Price, Holman & Stern, PLLC

[57] ABSTRACT

The present invention provides a repair fuse circuit capable of performing stable latch operation. The present invention improves the reliability of the repair fuse circuit using flash memory cells, by performing the initialization of the cross-coupled latch circuit at a high voltage level. The repair fuse circuit of a cross-coupled latch structure includes a voltage increasing element for temporally increasing voltage level of the cross-coupled latch circuit and a controller for controlling the voltage increasing element. As a result, the repair fuse circuit is initialized in a high logic state.

13 Claims, 4 Drawing Sheets

REPAIR FUSE CIRCUIT PERFORMING COMPLETE LATCH OPERATION USING FLASH MEMORY CELL

BACKGROUND OF THE INVENTION

1. Field of the Invention

The present invention relates to a repair fuse circuit and, more particularly, to a repair fuse circuit improving a latch operation using flash memory cells, by initializing a cross-coupled latch circuit in a predetermined high voltage level.

2. Description of the Related Arts

In general, a repair fuse circuit using flash memory cells has used a cross-coupled latch circuit in which the latch operation is naturally carried out by applied power voltage.

Referring now to FIG. 1A, the conventional repair fuse circuit includes two p-channel MOS transistors MP1 and MP2, two flash memory cells FC1 and FC2, n-channel MOS transistor MN1 and an inverter INT1. It should be noted that the flash memory cell FC2 consists of two flash memory cells connected in parallel.

The source of each of the p-channel MOS transistors MP1 and MP2 is commonly coupled to a power supply Vcc and the drain of p-channel MOS transistor MP1 is coupled to the drain of the flash memory cell FC1. Further, the drain of p-channel MOS transistor MP2 is coupled to the drain of the flash memory cell FC2. Accordingly, voltage from the power supply Vcc is applied to each drain of the two flash memory cells FC1 and FC2 via the p-channel MOS transistors MP1 and MP2.

In case where the flash memory cells are erased by the ultraviolet rays and the repair operation is not carried out, the amount of current flowing away through the flash memory cell FC2 may be twice as much as that through the flash memory cell FC1 because the flash memory cell FC2 consists of two memories which are connected in parallel and the flash memory FC1 consists of only one memory cell.

Accordingly, the drain of the flash memory cell FC2 is in a ground voltage level because the current flowing through the flash memory cell FC2 is passed through the n-channel MOS transistor MN1 and the drain of the flash memory cell FC1 is in a voltage level of Vcc. At this time, as shown in FIG. 1B, the gate of the n-channel transistor MN1 receives a fuse read signal FUSEREAD, As shown in FIG. 1B, at a node N2, the drain of the p-channel MOS transistor MP2, the drain of the flash memory cell FC2, the gates of the p-channel MOS transistor MP1 and the flash memory cell FC1 are connected is in a high voltage level and, at a node N1, the drain of the p-channel MOS transistor MP1, the drain of the flash memory cell FC1, the gates of the p-channel MOS transistor MP2 and the flash memory cell FC2 are connected is in a low voltage level. As a result, the output from the inverter INT1 is a fuse output signal of 0 V.

In case where the repair is carried out by programming the flash memory cell FC2, since no current flows through the flash memory cell FC2, the drain of the flash memory cell FC2 is in a high voltage level of Vcc and the drain of the flash memory cell FC1 is in a low voltage level of 0 V.

When a latch operation for the initialization may be erroneously performed in a low voltage level, the repair may be not performed. However, in this case, it appears as if the repair has been performed. That is, typically, the repair circuit is initialized in a low voltage level, but the latch operation may be erroneously performed. Although the power supply Vcc is going from low to high, this latch operation may be not corrected because the repair fuse circuit uses a cross-coupled structure.

SUMMARY OF THE INVENTION

An object of the present invention is to provide a repair fuse circuit capable of performing stable latch operation, by initializing it in a predetermined high voltage.

Another object of the present invention is to provide a repair fuse circuit of a cross-coupled latch structure used in a flash memory device.

In accordance with an aspect to the present invention, there is provided a repair fuse circuit of a cross-coupled latch circuit, wherein the repair fuse circuit has a first flash memory cell which is coupled to a first current providing means at a first node and at least two second flash memory cells which are coupled, in parallel, to a second current providing means at second node and wherein the first and second current providing means are coupled to a power supply, the repair fuse circuit comprising: a first means for precharging the first and second nodes; and a second means for generating a control signal to control the first means in order that the first means temporally precharges the first and second nodes, whereby the repair fuse circuit is initialized in a high logic state.

In accordance with another aspect to the present invention, there is provided a repair fuse circuit of a cross-coupled latch circuit, wherein the repair fuse circuit has a first flash memory cell which is coupled to a first current providing means at a first node and at least two second flash memory cells which are coupled, in parallel, to a second current providing means at second node and wherein the first and second current providing means are coupled to a power supply, the repair fuse circuit comprising: an enable delay means for increasing a voltage level in the first and second nodes, by cutting off a current path of the cross-coupled latch circuit.

In accordance with further another aspect to the present invention, there is provided a repair fuse circuit of a cross-coupled latch circuit in a flash memory device, wherein the repair fuse circuit has a flash memory cell coupled to a first current providing means at a first node and at least two flash memory cells which are coupled, in parallel, to a second current providing means at second node and wherein the first and second current providing means are coupled to a power supply, the repair fuse circuit comprising: a voltage increasing means for temporally increasing voltage level at the first and second nodes; and a control means for controlling the voltage increasing means, whereby the repair fuse circuit is initialized in a high logic state.

BRIEF DESCRIPTION OF THE DRAWINGS

Other objects and aspects of the present invention will become apparent from the following description of embodiments with reference to the accompanying drawings in which.

DETAILED DESCRIPTION OF THE PREFERRED EMBODIMENTS

Hereinafter, the present invention will be described below referring the accompanying drawings.

First, to prevent an output error from being generated by a low voltage level, the present invention increases an initialization voltage up to a predetermined voltage level when the initialization of the repair fuse circuit is required. That is, the repair fuse circuit according to the present invention is initialized at a relatively high voltage level. Although an erroneous latch operation has been caused by a low voltage level, the repair fuse circuit according to the present invention can performs a stable latch operation with the increase of the initialization voltage level.

Figure 1A:
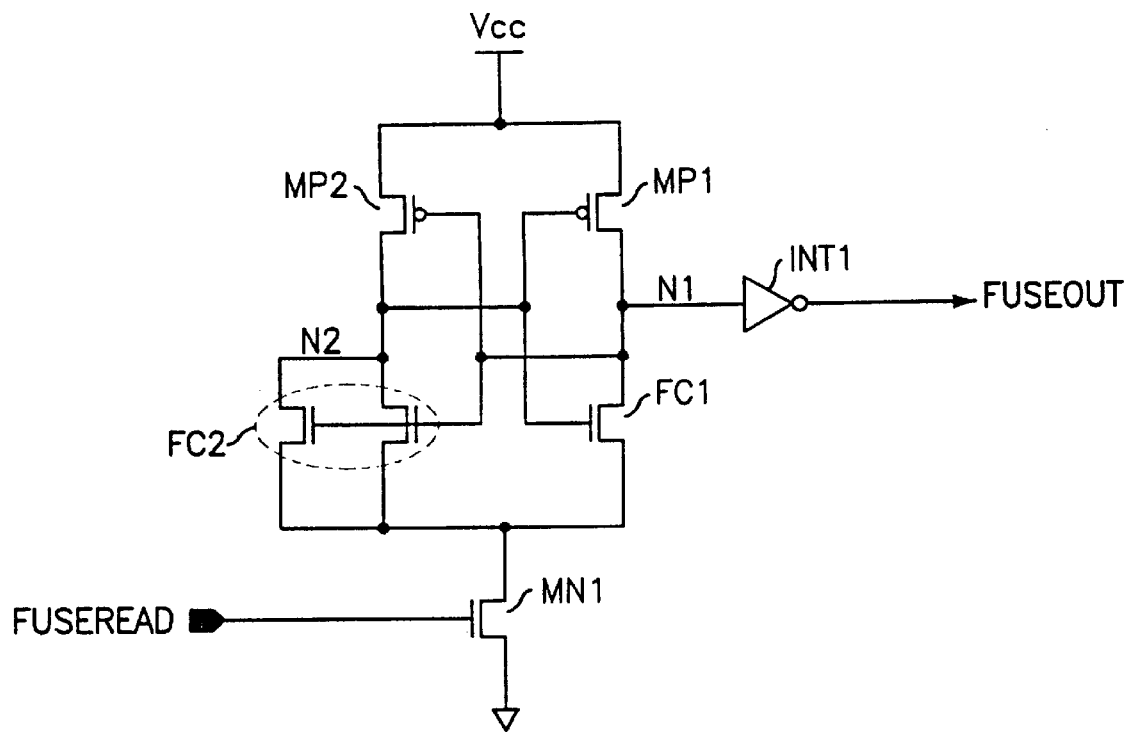
FIG. 1A is a block diagram illustrating a conventional repair fuse circuit.
Figure 1B:
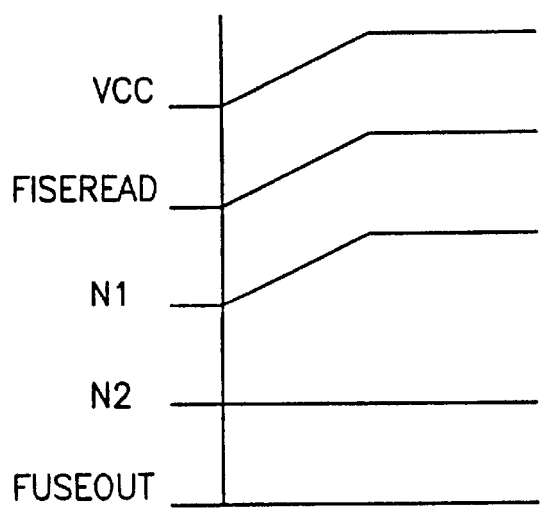
FIG. 1B is a timing diagram illustrating the conventional repair fuse circuit of FIG. 1A.
Figure 2A:
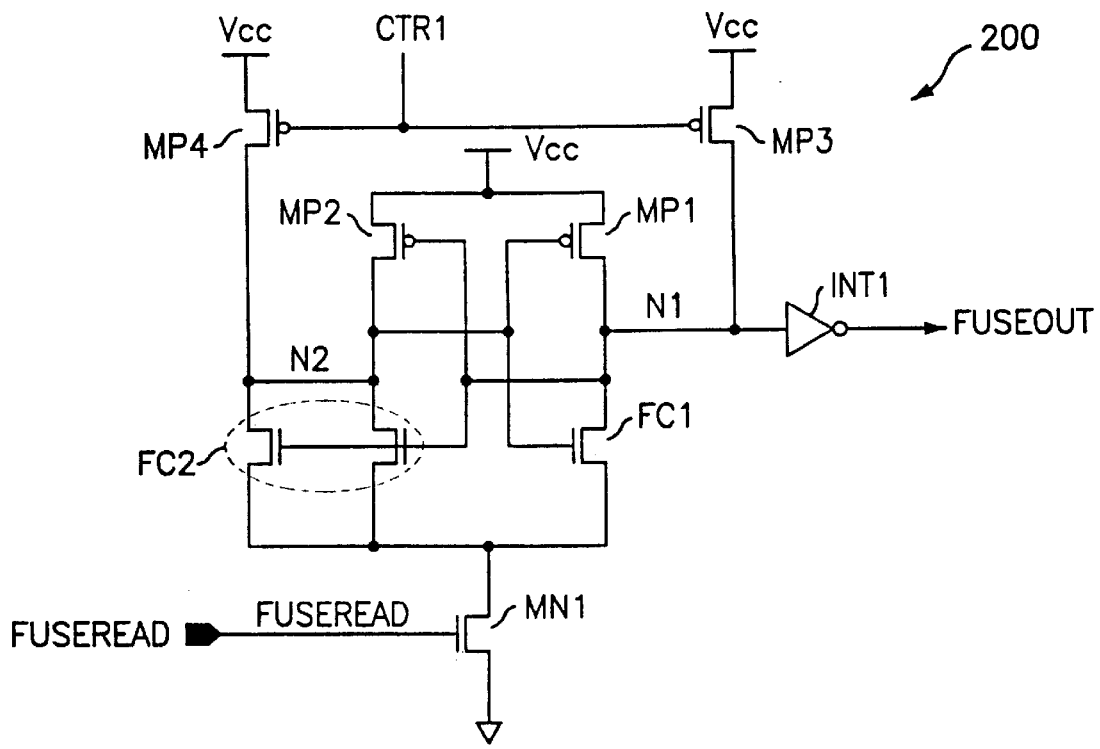
FIG. 2A is a block diagram illustrating a repair fuse circuit in accordance with an embodiment of the present invention.
Figure 2B:
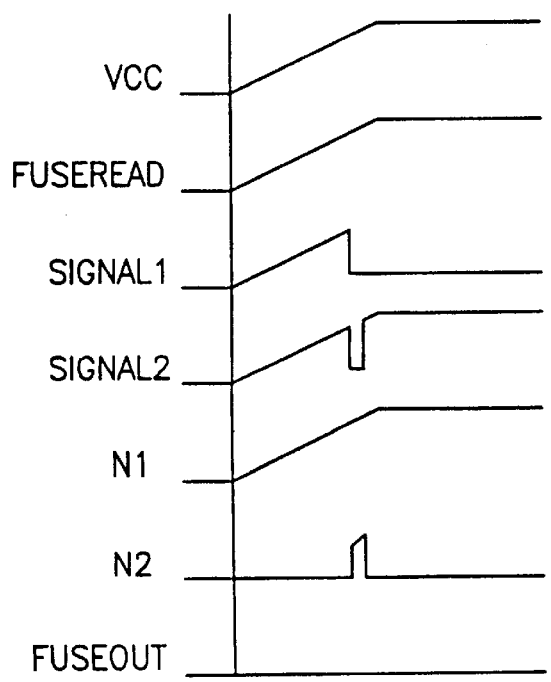
FIG. 2B is a timing diagram illustrating the repair fuse circuit of FIG. 2A.

First, the elements shown in FIG. 2A which are the same as those in FIG. 1A has the same reference numerals. Referring to FIG. 2A, a repair fuse circuit 200 in accordance with an embodiment of the present invention includes the same cross-coupled latch circuit as that shown in FIG. 1A. In addition, the repair fuse circuit 200 includes p-channel MOS transistors MP3 and MP4 which are respectively connected to the nodes N1 and N2. In other words, the p-channel MOS transistor MP3 has a source connected to a power supply Vcc and a drain connected to the node N1 (to which the drain of the flash memory cell FC1 is connected). Also, the p-channel MOS transistor MP4 has a source connected to a power supply Vcc and a drain connected to the node N2 (to which the drain of the flash memory cell FC2 is connected). A control signal CTR1 generated by a control signal generator is applied to the gates of the p-channel MOS transistors MP3 and MP4.

Figure 3A:
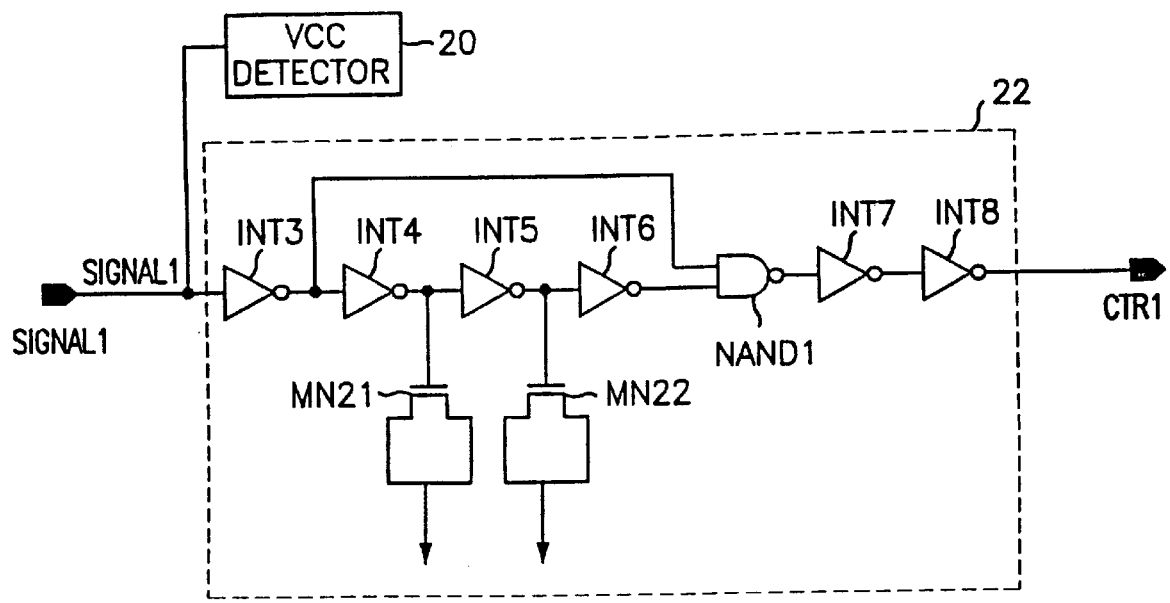
FIG. 3A is a block diagram illustrating a control signal generator used in the repair fuse circuit of FIG. 2A.

FIG. 3A is a block diagram illustrating the control signal generator providing the control signal CTR1 for the gates of the p-channel MOS transistors MP3 and MP4. The control signal generator includes a Vcc detector 20 and a pulse generator 22. Also, the pulse generator 22 includes four inverters INT3 to INT6, which are connected in series, a NAND gate NAND1 which receives the output signals from the inverters INT3 and INT6, and two inverters INT7 and INT8, which are connected in series. The inverter INT7 is connected to the output terminal of the NAND gate NAND1. Also, the pulse generator 22 includes n-channel MOS transistors MN21 and MN22 for capacitive coupling. That is, the source and drain of the n-channel MOS transistors MN21 and MN22 are coupled to the ground voltage level and the gates thereof are respectively connected to the output terminals of the inverters INT4 and INT5.

Figure 3B:
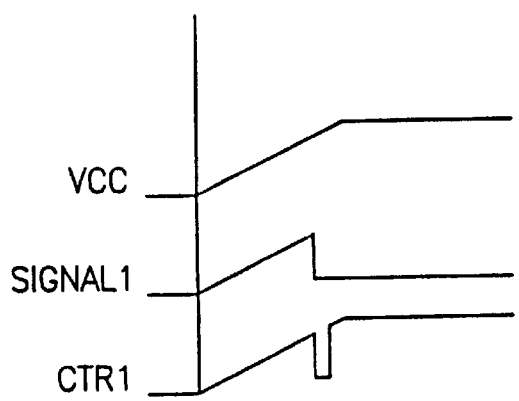
FIG. 3B is a timing diagram illustrating the control signal generator of FIG. 3A.

The Vcc detector 20 receiving the voltage Vcc provides to the inverter INT3 of the pulse generator 22 an output signal SIGNAL1 whose voltage is approximately 70% of the voltage Vcc. The pulse generator 22 receiving the output signal SIGNAL1 generates the control signal CTR1. As shown in FIG. 3B, the control signal CTR1 has been in a low logic state for a short time since the output signal SIGNAL1 went from a high logic state to a low logic state.

Referring again to FIG. 2A, if the control signal CTR1 is applied to the gates of the p-channel MOS transistors MP3 and MP4, the repair fuse circuit 200 is initialized again. In this initialization operation in which the flash memory cell is not programmed, the node N2 is in a high logic state when the control signal CTR1 in a low logic state is applied to the gate of the p-channel MOS transistors MP4. Also, the node N1 is in a high logic state and an output signal FUSEOUT of the repair fuse circuit 200 is continuously maintained in a low logic state. As a result, since the repair fuse circuit 200 is initialized at a high voltage which is 70% of the voltage Vcc, there is no probability of erroneous latch operation due to a low voltage level.

Figure 4A:
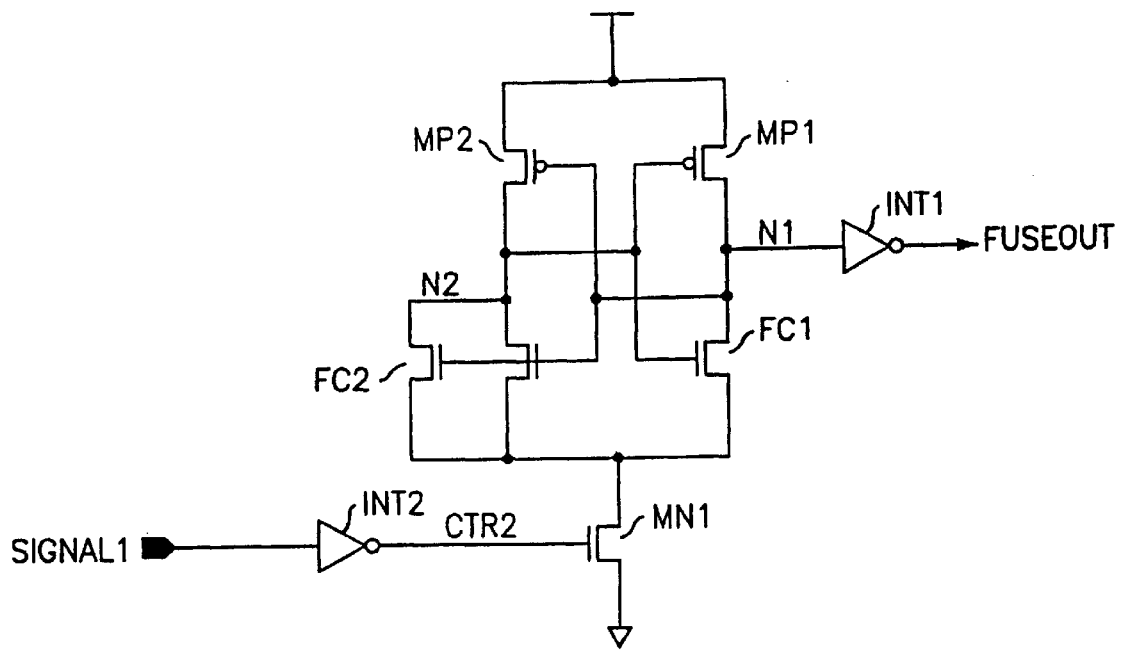
FIG. 4A is a block diagram illustrating a repair fuse circuit in accordance with another embodiment of the present invention.
Figure 4B:
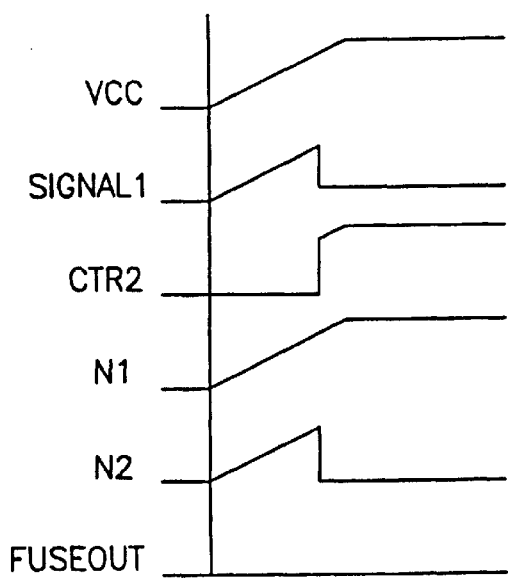
FIG. 4B is a timing diagram illustrating the repair fuse circuit of FIG. 4A.

FIG. 4A is a block diagram illustrating a repair fuse circuit in accordance with another embodiment of the present invention and FIG. 4B is a timing diagram illustrating the repair fuse circuit of FIG. 4A.

Referring to FIGS. 4A and 4B, a control signal CTR2 for enabling the cross-coupled latch circuit is produced by the output signal SIGNAL1 from the Vcc detector 20. That is, the control signal CTR2 is generated by inverting the output signal SIGNAL1 from the Vcc detector 20 via an inverter INT2. Since the output signal SIGNAL1 is generated at 70% of the voltage Vcc, the initialization operation is carried out at a high voltage level, securing the stable latch operation.

As apparent from the above description, the present invention improves the reliability of the repair fuse circuit using flash memory cells, by performing the initialization of cross-coupled latch circuit in a high voltage level.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A repair fuse circuit of a cross-coupled latch circuit, comprising:

a first flash memory cell coupled to a first current providing means at a first node;

at least two second flash memory cells coupled, in parallel, to a second current providing means at a second node, wherein the first and second current providing means are coupled to a power supply;

a first means for precharging the first and second nodes; and a second means for generating a control signal to control the first means in order that the first means temporally precharges the first and second nodes, whereby the repair fuse circuit is initialized in a high logic state.

2. The repair fuse circuit in accordance with claim 1, wherein the first means for precharging the first and second nodes comprises a first pull-up transistor coupled to the first node and a second pull-up transistor coupled to the second node.

3. The repair fuse circuit in accordance with claim 1, wherein the second means for generating a control signal comprises:

a voltage detecting means for detecting whether the power supply increases up to a selected voltage level; and a pulse generating means for receiving an output from the voltage detecting means and generating the control signal.

4. The repair fuse circuit in accordance with claim 3, wherein the pulse generating means comprises:

a plurality of first inverting means coupled in series to the voltage detecting means;

at least one capacitive coupling means coupled in parallel to the first inverting means;

an NAND logic means for NANDing outputs from two inverting means of a plurality of the first inverting mean; and a plurality of second inverting means coupled in series the NAND logic means.

5. The repair fuse circuit in accordance with claim 4, wherein the capacitive coupling means is an n-channel MOS transistor having a gate connected to the output terminal of the first inverting means and source and drain connected to a ground voltage level.

6. A repair fuse circuit of a cross-coupled latch circuit, comprising:

a first flash memory cell coupled to a first current providing means at a first node;

at least two second flash memory cells which are coupled, in parallel, to a second current providing means at a second node, wherein the first and second current providing means are coupled to a power supply;

enable delay means for increasing a voltage level in the first and second nodes, by cutting off a current path of the cross-coupled latch circuit.

7. The repair fuse circuit in accordance with claim 6, wherein the enable delay means comprises:

a voltage detecting means for detecting whether the power supply increases up to a selected voltage level;

an inverting means for inverting an output from the voltage detecting means for providing an enable signal for the cross-coupled latch circuit.

8. A repair fuse circuit of a cross-coupled latch circuit in a flash memory device, comprising:

a flash memory cell coupled to a first current providing means at a first node;

at least two flash memory cells which are coupled, in parallel, to a second current providing means at a second node, wherein the first and second current providing means are coupled to a power supply;

a voltage increasing means for temporally increasing voltage level at the first and second nodes; and a control means for controlling the voltage increasing means, whereby the repair fuse circuit is initialized in a high logic state.

9. The repair fuse circuit in accordance with claim 8, wherein the voltage increasing means comprises a first pull-up transistor coupled to the first node and a second pull-up transistor coupled to the second node.

10. The repair fuse circuit in accordance with claim 8, wherein the control means comprises:

a voltage detecting means for detecting whether the power supply increases up to a selected voltage level; and an enable delay means for increasing a voltage level in the first and second nodes, by cutting off a current path of the cross-coupled latch circuit.

11. The repair fuse circuit in accordance with claim 8, wherein the control means comprises:

a voltage detecting means for detecting whether an applied power supply increases up to a selected voltage level; and a pulse generating means for receiving an output from the voltage detecting means and generating the control signal.

12. The repair fuse circuit in accordance with claim 11, wherein the pulse generating means comprises:

a plurality of first inverting means coupled in series to the voltage detecting means;

at least one capacitive coupling means coupled in parallel to the first inverting means;

an NAND logic means for NANDing outputs from two inverting means of a plurality of the first inverting mean; and a plurality of second inverting means coupled in series the NAND logic means.

13. The repair fuse circuit in accordance with claim 12, wherein the capacitive coupling means is an n-channel MOS transistor having a gate connected to the output terminal of the first inverting means and source and drain connected to a ground voltage level.

* * * * *